(12) United States Patent
Yen et al.

(10) Patent No.: US 6,677,659 B2
(45) Date of Patent: Jan. 13, 2004

(54) METHOD FOR FABRICATING 3-DIMENSIONAL SOLENOID AND DEVICE FABRICATED

(75) Inventors: Kaihsiang Yen, Taipei (TW); Jing-Hung Chiou, Taipei (TW); Yi-Shiau Chen, Yunlin (TW); Su-I Cheng, Chutung Hsinchu (TW)

(73) Assignee: Industrial Technologies Research Institute, Hsin Chu (TW)

( * ) Notice: Subject to any disclaimer, the term of this patent is extended or adjusted under 35 U.S.C. 154(b) by 65 days.

(21) Appl. No.: 10/004,920

(22) Filed: Dec. 5, 2001

(65) Prior Publication Data

US 2003/0104650 A1 Jun. 5, 2003

(51) Int. Cl.$^7$ ............................................. H01L 29/00
(52) U.S. Cl. ...................... 257/531; 257/510; 438/51; 438/52; 430/320
(58) Field of Search ............................ 438/51, 680, 52; 430/320; 257/531, 396, 510, 516

(56) References Cited

U.S. PATENT DOCUMENTS

| | | | | |
|---|---|---|---|---|
| 5,412,265 A | * | 5/1995 | Sickafus | 310/40 |
| 6,116,863 A | * | 9/2000 | Ahn et al. | 417/322 |
| 6,392,524 B1 | * | 5/2002 | Biegelsen et al. | 336/200 |

* cited by examiner

Primary Examiner—Caridad Everhart
(74) Attorney, Agent, or Firm—Tung & Associates

(57) ABSTRACT

A method for fabricating a 3-dimensional solenoid utilizing a CMOS fabrication technology and a back end process without using photomasking is described. In the method, two suspended arms each formed of a bi-layered metal structure from metals that have different residual stress or coefficients of thermal expansion are utilized for connecting to an inductor coil formed of AlCu in-between the two arms. When the insulating layer of silicon dioxide is removed from the suspended arms, the free ends of the arms curve up and thus, raise the inductor coil away from the surface of the semiconductor substrate into a 3-dimensional structure.

20 Claims, 3 Drawing Sheets

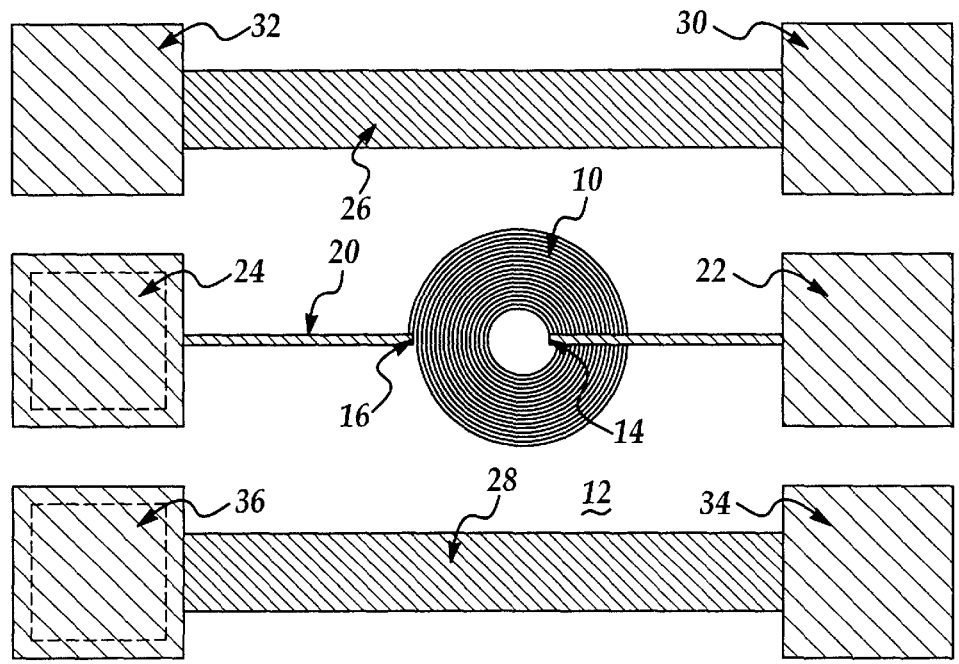
*Figure 1*
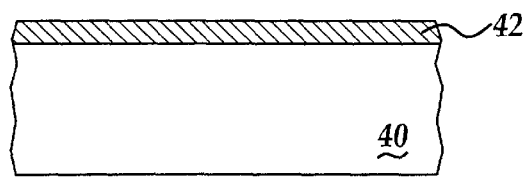
*Figure 2A*
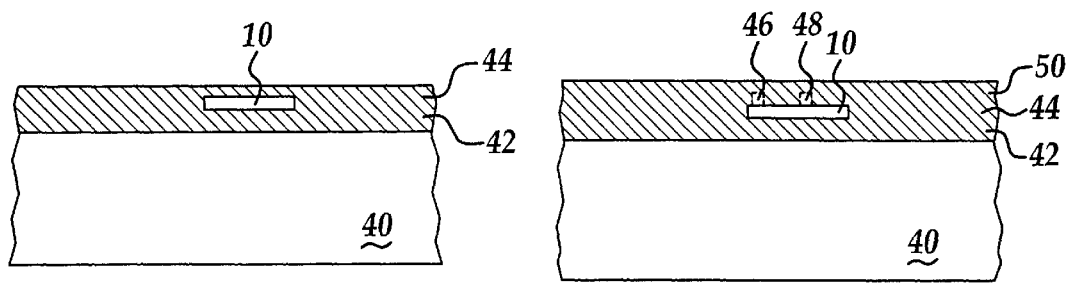
*Figure 2B*     *Figure 2C*

METHOD FOR FABRICATING 3-DIMENSIONAL SOLENOID AND DEVICE FABRICATED

FIELD OF THE INVENTION

The present invention generally relates to a method for fabricating a 3-dimensional solenoid incorporating an inductor coil and device fabricated, and more particularly, relates to a method for fabricating a 3-dimensional solenoid by a micro-electro-mechanical-system (MEMS) wherein a 3-D inductor coil is fabricated by CMOS technology and device fabricated by the method.

BACKGROUND OF THE INVENTION

Miniaturization of motors, actuators and similar machine parts is receiving increasing attention because of the new uses of these devices made possible because of their small size. Additionally, these devices can be manufactured in large quantities at low piece-part cost. Current designs of miniaturized machine parts can be categorized according to size or scale. Macroscopic machine parts have a length in the range of approximately 1 to 10 inches, and while microscopic machine parts, sometimes referred to as MEMS (Micro Electro Mechanical Systems) have a length in the range of 0.01 to 1 inch.

In any event, existing miniaturized actuators and motors of both macroscopic of microscopic size are essentially replicas of larger motors, and thus include such component parts as windings, stators, gears, transmission links, etc. These miniaturized parts must be assembled with high precision in order to produce an operable device providing the desired function, e.g. movement of an electrically activated component that then mechanically engages other parts to induce motion. Depending upon the engagement configuration, this motion may be linear in any of several axes, rotary, circular, etc. Because of the number of complex parts that must be assembled with a high degree of precision, the yields of parts meeting target specifications and performance are relatively low using current manufacturing processes. These low yields in turn increase the cost of the parts. Accordingly, it would be desirable to provide a new form of actuator and related method for inducing movement of an object on a microscopic or macroscopic scale which eliminates the problems mentioned above.

The MEMS technology has recently been extended to the semiconductor fabrication industry. In the present state of the art, a semiconductor device is normally formed in a planar structure and therefore the process for fabricating the semiconductor device is generally a planar process. For instance, layers of different materials, i.e. such as insulating materials and metallic conducting materials, are deposited one on top of one another and then features of the device are etched through the various layers. The planar fabrication process, while adequate in fabricating most semiconductor elements and devices, is not suitable for fabricating certain devices that are 3-dimensional in nature. For instance, a 3-D solenoid, i.e. or a 3-D inductor coil, must be fabricated by stacking a large number of layers from the bottom to the top and therefore, requires a large number of photomasks to complete the task. For instance, when CMOS technology is used in forming such 3-D solenoid, at least four other steps utilizing photomasks must be incorporated in order to complete the fabrication process. Moreover, the precise alignment between the layers is necessary in order to avoid a variety of processing difficulties occurring at the interfaces.

Another limitation imposed by the planar processing technology is that only a square or rectangular-shaped 3-D solenoid can be fabricated. A 3-D solenoid of circular shape cannot be fabricated by such technology. In order to raise a 3-D solenoid from a semiconductor substrate, very thick photoresist layers and electroplating techniques for filling large aspect ratio structures must also be utilized, which further increases the complexity of the fabrication process.

3-D solenoids or inductor coils have been widely used in radial frequency (RF) communication technologies. It is especially critical for RF passive telecommunication devices which require high quality factor inductors. For instance, such high quality factor inductors include those utilized in RF filters or RF oscillators. Presently, RF telecommunication devices utilize inductor coils that are planar inductor coils which produces a magnetic field that is perpendicular to the device substrate. As a result, induced currents are produced in a silicon substrate, thus causing significant energy loss, and consequently, leading to a low quality factor. This prevents the use of such devices at even higher radio frequencies. For instance, presently fabricated components for telecommunication equipment such as passive elements of inductor coils, capacitors and resistors cannot be fabricated on the same silicon substrate with the active elements. Instead, such passive elements are assembled together with the active elements on a circuit board producing a circuit board of very large area to accommodate the passive elements. If the passive elements can be combined with the active elements on the same semiconductor substrate, the size of the communication module can be significantly reduced.

It is therefore an object of the present invention to provide a method for fabricating a 3-D solenoid that does not have the drawbacks or shortcomings of the conventional methods for fabrication.

It is another object of the present invention to provide a 3-D solenoid which can be fabricated by a MEMS technology.

It is a further object of the present invention to provide a 3-D solenoid that can be fabricated on a semiconductor substrate by CMOS technology.

It is another further object of the present invention to provide a 3-D solenoid fabricated by MEMS technology such that the solenoid can be self-assembled without the need of any additional actuation or monitoring.

It is still another object of the present invention to provide a method for fabricating a 3-D solenoid by a CMOS technology on a silicon substrate and then raising the planar spiral of the inductor from the substrate and pulling apart into a 3-D coil.

It is yet another object of the present invention to provide a method for fabricating a 3-D solenoid monolithically on one chip and then automatically raising the planar spiral fabricated.

SUMMARY OF THE INVENTION

In accordance with the present invention, a method for fabricating a 3-dimensional solenoid and the solenoid device fabricated are disclosed.

In a preferred embodiment, a method for fabricating a 3-dimensional solenoid can be carried out by the operating steps of providing a pre-processed semiconductor substrate; depositing a first silicon dioxide layer on a top surface of the substrate; depositing a layer of a first metal on the first silicon dioxide layer; patterning the first metal layer into an inductor coil having a first end at near the center and a second end at an outer periphery of the inductor coil; depositing a second silicon dioxide layer on top of the inductor coil and the first silicon dioxide layer; patterning via openings in the second silicon dioxide layer exposing the first end and the second end of the inductor coil; filling the via openings with a second metal forming two vias over the first end and the second end of the inductor coil, respectively; depositing a third silicon dioxide layer over the two vias and the second silicon dioxide layer; patterning first trench openings for suspended arms in the third silicon dioxide layer with inner ends of the first trench openings exposing the two vias; depositing a layer of the first metal into the trenches forming two suspended arms; depositing a fourth silicon dioxide layer over the two suspended arms and the third silicon dioxide layer; patterning second trench openings on and exposing the two suspended arms; depositing a third metal in the second trench openings, the third metal may have a coefficient of thermal expansion smaller than, or a residual stress larger than, that for the second metal forming bi-layered suspended arms; and removing the first, second, third and fourth silicon dioxide layers from the top surface of the substrate and exposing the inductor coil, the vias and the bi-layered suspended arms.

The method for fabricating a 3-dimensional solenoid may further include the step of filling the via openings with W, or the step of filling the via openings by a W CVD process. The method may further include the step of depositing the first metal of AlCu and the third metal of Ni forming the bi-layered suspended arms. The method may further include the step of depositing the first metal of AlCu and the third metal of Cr forming the bi-layered suspended arms. The first metal forming the inductor coil may be AlCu. The method may further include the step of removing the first, second, third and fourth silicon dioxide layers by a wet etch technique or by a reactive ion etching technique. The method may further include the step of depositing the third metal of Ni by an electroless plating technique, or the step of depositing the third metal of Cr by a sputtering technique.

The present invention is further directed to a 3-dimensional solenoid which includes a pre-processed semiconductor substrate; two suspended arms each having a free end spaced-apart from a top surface of the substrate and a fixed end attached to the substrate, each of the two suspended arms may be formed of a bi-layer metal laminate wherein a bottom metal layer is formed of a first metal and a top metal layer is formed of a second metal that has a coefficient of thermal expansion smaller than, or a residual stress larger than, that of the second metal such that the ends of the suspended arms curve upwardly away from the substrate; and an inductor coil formed of a conductive metal that has two ends each connected to one of the free ends of the suspended arms, respectively, for providing electrical communication between the two fixed ends of the suspended arms.

In the 3-dimensional solenoid, the substrate may be a Si substrate, the curved first metal arm which forms the bottom metal layer may be AlCu, the second metal forming the top metal layer may be Ni or Cr, and the inductor coil may be formed of AlCu. The 3-dimensional solenoid may further comprise via means connecting in-between the free ends of the suspended arms and the two ends of the inductor coil, respectively. The solenoid may be formed in a ground-signal-ground configuration for RF communication. The inductor coil may be formed in circular shape or formed in rectangular shape. The via means may be formed of a metal.

BRIEF DESCRIPTION OF THE DRAWINGS

These and other objects, features and advantages of the present invention will become apparent from the following detailed description and the appended drawings in which:

FIG. 1 is a plane view of a present invention 3-D inductor coil before structure release.

FIG. 2A is an enlarged, cross-sectional view of a present invention substrate with a first layer of silicon dioxide deposited thereon.

FIG. 2B is an enlarged, cross-sectional view of the present invention semiconductor substrate of FIG. 2A with the inductive coil deposited and formed in the silicon dioxide layer.

FIG. 2C is an enlarged, cross-sectional view of the present invention semiconductor substrate of FIG. 2B with metal vias formed on the two ends of the inductive coil.

DETAILED DESCRIPTION OF THE PREFERRED EMBODIMENT

Figure 2D:
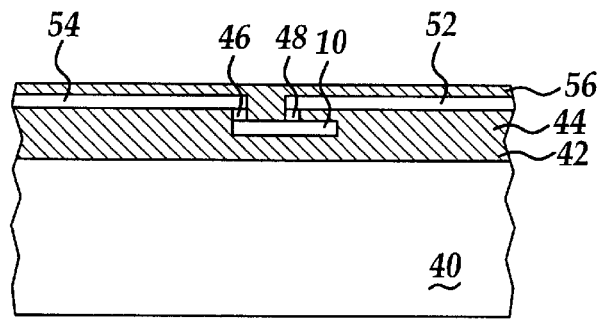
FIG. 2D is an enlarged, cross-sectional view of the present invention semiconductor substrate of FIG. 2C with two suspended arms formed connecting to the two vias, respectively.

The present invention discloses a 3-dimensional solenoid formed by an inductor coil on a semiconductor substrate by a MEMS technique and the 3-D solenoid formed by the method.

In the method, a silicon substrate is first provided with a silicon dioxide layer deposited on top. An inductor coil is then formed on the silicon dioxide layer by photolithography from a metal such as AlCu. At two ends of the inductor coil, is then formed metal vias by a tungsten chemical vapor deposition technique. Two suspended arms, each connected at an inner end to a metal via, are then formed on the silicon dioxide layer and then insulated by the silicon dioxide layer. A second metallic material that has a coefficient of thermal expansion smaller than, or a residual stress larger than, the first metallic material forming the suspended arm is then deposited on top of the arms. A suitable second metallic material may be Ni or Cr, or any other suitable metals. The various layers of insulating materials, i.e. the silicon dioxide layers, are then removed by either a wet etching technique or by a dry etching technique of reactive ion etching to expose the 3-dimensional solenoid formed. The bi-layered suspended arm curves up such that the free ends that are connected to the metal vias curves away from the surface of the substrate so as to raise the inductor coil into the space above the substrate, i.e. forming a 3-dimensional solenoid.

By using the present invention novel method, polygon-shaped or circular-shaped 3-D solenoids can be fabricated. In the front end of the fabrication process, the CMOS technology can be utilized. The back end of the process can be carried out without the need for photomasking steps. The present invention novel method therefore reduces the complexity of conventional fabrication processes and furthermore, the 3-D solenoid fabricated by the present invention novel method has the advantages of:

1. The 3-D solenoid is raised by two suspended arms from the semiconductor substrate and thus, the distance between the solenoid and the substrate is increased to reduce parasitic capacitance between the solenoid and the substrate.
2. When a circular-shaped solenoid is fabricated by the present invention novel method, the energy loss at 90° turns existed in the rectangular-shaped solenoid can be reduced and thus, the quality of the solenoid can be improved.
3. In the present invention 3-D solenoid, the direction of the magnetic field generated is parallel to the surface of the substrate and therefore, the probability of producing undesirable induced current on the substrate and the resulting energy loss can be reduced.

The present invention novel method can be automated during its assembly and therefore, does not require any additional actuation or monitoring. For instance, FIG. 1 illustrates a plane view of a present invention 3-D solenoid 10 that is fabricated on a substrate 12 before structure release. The solenoid 10 is formed of a metallic material such as AlCu, or any other suitable metal for the inductor application. Two ends 14,16 of the inductor coil 10, at near the center and at the outer periphery, respectively, are connected to two suspended arms 18,20, respectively. At the other end of the free ends 14,16, are the fixed ends 22 and 24 which are fixed to the semiconductor substrate 12. Surrounding the present invention inductor coil 10, are two metal bars 26,28 that are formed of the same metallic material as that used to form the suspended arms 18,20. Each of the metal bars 26,28 are connected to a fixed end 30,32,34 and 36.

The fabrication steps for the present invention inductor coil 10 are shown in FIGS. 2A~2G. The present invention novel method can be started, as shown in FIG. 2A, on a silicon substrate 40 with a silicon dioxide layer 42 deposited thereon. In the next step of the process, as shown in FIG. 2B, a metal layer (not shown) is first deposited and then patterned into an inductor coil 10, and then covered by a second silicon dioxide layer 44. After via openings (not shown) are formed in the second silicon dioxide layer 44, metal vias 46,48 are formed by depositing a second metal into the via openings thus forming the vias. A suitable process for forming the vias 46,48 is a tungsten CVD method, or the deposition of any other suitable metals. On top of the tungsten vias 46,48, is then deposited a third silicon dioxide layer 50 for the forming of suspended arms 52,54 as shown in FIG. 2D. A fourth silicon dioxide layer 56 is then deposited on top of the second metal layer and the suspended arms 52,54 formed.

Figure 2E:
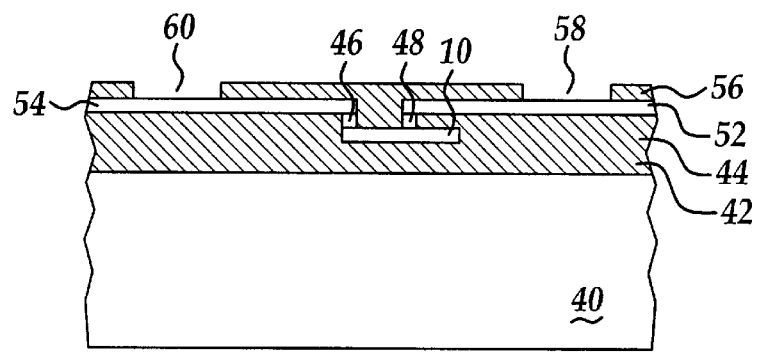
FIG. 2E is an enlarged, cross-sectional view of the present invention semiconductor substrate of FIG. 2D with the $SiO_2$ layer patterned.
Figure 2F:
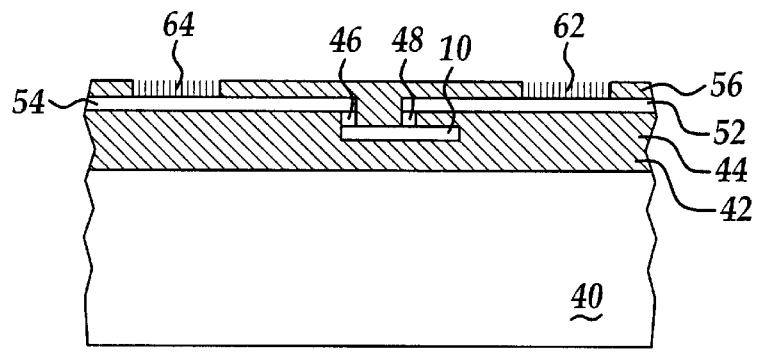
FIG. 2F is an enlarged, cross-sectional view of the present invention semiconductor substrate of FIG. 2E with a different metal deposited on top of the suspended arms forming a bi-layer structure.
Figure 2G:
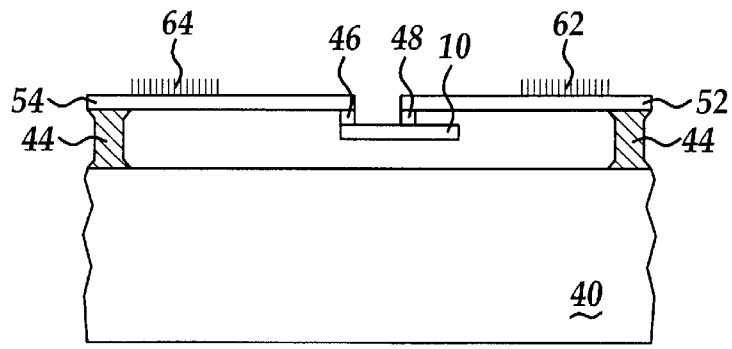
FIG. 2G is an enlarged, cross-sectional view of the present invention semiconductor substrate of FIG. 2F with all the silicon dioxide layers removed by an etching process.

In the next step of the process, shown in FIGS. 2E–2F, trench openings 58,60 are formed photolithographically in the fourth silicon dioxide layer 56. A third metallic material is then deposited to form metal layers 62,64 laminated to the suspended arms 52,54. The third metallic material forming the metal layers 62,64 may have a CTE, or residual stress, that is different than the CTE, or thermal stress, of the second metallic material used to form the suspended arms 52 and 54. For instance, when AlCu is used to form the suspended arms 52,54, the third metallic material should be Ni or Cr that have a lower CTE, or higher residual stress, compared to AlCu. The larger CTE, or lower residual stress, of the suspended arms 52,54, i.e. the differential CTE, or residual stress, between the metal layers 62,64 formed of the third metallic material and the suspended arms 52,54 causes the arms to curve upwardly away from the top surface of the substrate once the silicon dioxide layers 42,44 and 56 are removed by either a wet etching process or by a reactive ion etching process. This is shown in FIGS. 2G and 3.

Figure 3:
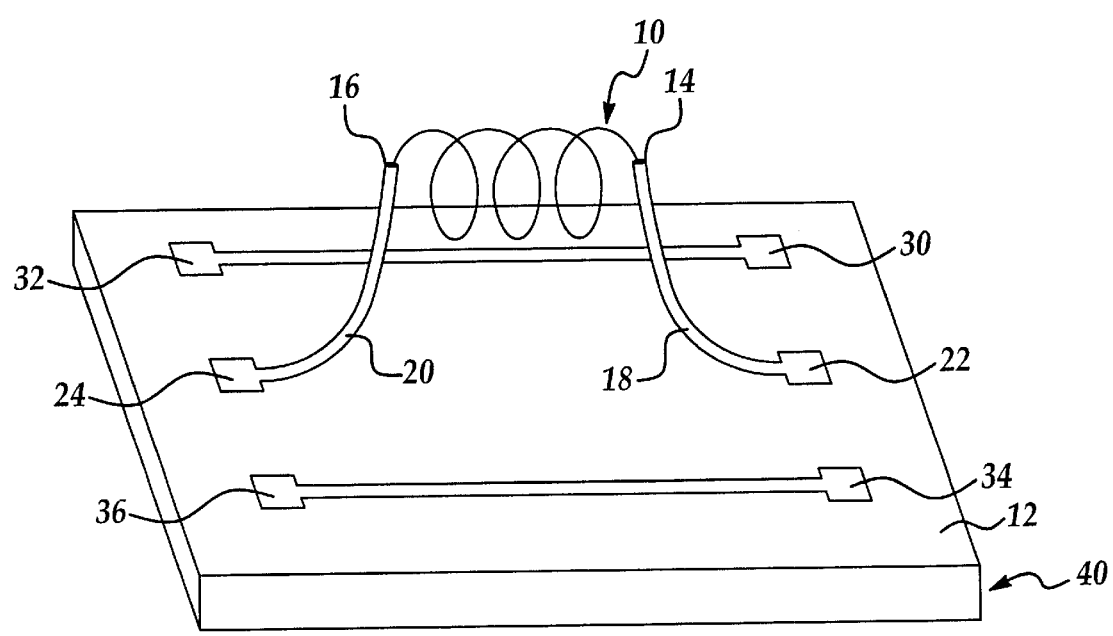
FIG. 3 is a perspective view of the present invention 3-D solenoid after the suspended arms are raised at the free end due to a difference in CTE of the metal layers or residual stress forming the suspended arm.

It should be noted that, in FIG. 3, for simplicity reasons, the bi-layered structure of the suspended arms 18 and 20 are not shown even though a metal layer of Ni or Cr is deposited on a base metal layer of AlCu to allow the curving action of the arms. Once the suspended arms 18,20 are curved up at its free ends 14,16, the inductor coil 10 is pulled up away from the top surface 12 of the silicon substrate 40 and thus, into a 3-D configuration when the coil 10 is pulled apart by the two suspended arms 18 and 20.

The effective radius of curvature for the suspended arms that are formed of a Cr layer laminated on top of Al according to the Cr/Al thickness ratio. In the example given, the thickness of the base metal layer Al deposited is about 0.8 $\mu$m thick. The thickness of the top layer of Cr is between 0.05 and 0.4 that of Al.

The present invention novel method for fabricating a 3-dimensional solenoid on a semiconductor substrate and the solenoid thus fabricated are described in the above description and in the appended drawings of FIGS. 1~4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for fabricating a 3-dimensional solenoid comprising the steps of:

providing a pre-processed semiconductor substrate;

depositing a first silicon dioxide layer on a top surface of said substrate;

depositing a layer of a first metal on said first silicon dioxide layer;

patterning said first metal layer into an inductor coil having a first end at near the center and a second end at an outer periphery of said inductor coil;

depositing a second silicon dioxide layer on top of said inductor coil and said first silicon dioxide layer;

patterning via openings in said second silicon dioxide layer exposing said first end and said second end of said inductor coil;

filling said via openings with a second metal forming two vias over said first end and said second end of the inductor coil, respectively;

depositing a third silicon dioxide layer over said two vias and said second silicon dioxide layer;

patterning first trench openings f or suspended arms in said third silicon dioxide layer with inner ends of said first trench openings exposing said two vias;

depositing a layer of said first metal into said trenches forming two suspended arms;

depositing a fourth silicon dioxide layer over said two suspended arms and said third silicon dioxide layer;

patterning second trench openings on and exposing said two suspended arms;

depositing a third metal in said second trench openings, said third metal having a coefficient of thermal expansion smaller than that for said first metal forming bi-layered suspended arms; and removing said first, second, third and fourth silicon dioxide layers from said top surface of the substrate and exposing said inductor coil, said vias and said bi-layered suspended arms.

2. A method for fabricating a 3-dimensional solenoid according to claim 1 further comprising the step of filling said via openings with W.

3. A method for fabricating a 3-dimensional solenoid according to claim 1 further comprising the step of filling said via openings by a W CVD process.

4. A method for fabricating a 3-dimensional solenoid according to claim 1 further comprising the step of depositing said first metal of AlCu and said third metal of Ni forming said bi-layered suspended arms.

5. A method for fabricating a 3-dimensional solenoid according to claim 1 further comprising the step of depositing said first metal of AlCu and said third metal of Cr forming said bi-layered suspended arms.

6. A method for fabricating a 3-dimensional solenoid according to claim 1, wherein said first metal forming said inductor coil is AlCu.

7. A method for fabricating a 3-dimensional solenoid according to claim 1 further comprising the step of removing said first, second, third and fourth silicon dioxide layers by a wet etch technique.

8. A method for fabricating a 3-dimensional solenoid according to claim 1 further comprising the step of removing said first, second, third and forth silicon dioxide layers by a reactive ion etching technique.

9. A method for fabricating a 3-dimensional solenoid according to claim 1 further comprising the step of depositing said third metal of Ni by an electroless plating technique.

10. A method for fabricating a 3-dimensional solenoid according to claim 1 further comprising the step of depositing said third metal of Cr by a sputtering technique.

11. A 3-dimensional solenoid comprising:

a pre-processed semiconductor substrate;

two suspended arms each having a free end spaced-apart from a top surface of said substrate and a fixed end attached to said top surface of the substrate, each of said two suspended arms being formed of a bi-layer metal laminate wherein a bottom metal layer is formed of a first metal and a top metal layer is formed of a second metal having a coefficient of thermal expansion smaller than that of the first metal such that the ends of said suspended arms curve upwardly; and an inductor coil formed of a conductive metal having two ends each connected to one of said free ends of the suspended arms, respectively, for providing electrical communication between said two fixed ends of said suspended arms.

12. A 3-dimensional solenoid according to claim 11, wherein said substrate is a Si substrate.

13. A 3-dimensional solenoid according to claim 11, wherein said first metal forming said bottom metal layer is AlCu.

14. A 3-dimensional solenoid according to claim 11, wherein said second metal forming said top metal layer is Ni or Cr.

15. A 3-dimensional solenoid according to claim 11, wherein said inductor coil being formed of AlCu.

16. A 3-dimensional solenoid comprising:

a pre-processed semiconductor substrate;

two suspended arms each having a free end spaced-apart from a top surface of said substrate and a fixed end attached to said top surface of the substrate, each of said two suspended arms being formed of a bi-layer metal laminate wherein a bottom metal layer is formed of a first metal and a top metal layer is formed of a second metal having a coefficient of thermal expansion smaller than that of the first metal such that the ends of said suspended arms curve upwardly;

an inductor coil formed of a conductive metal having two ends each connected to one of said free ends of the suspended arms, respectively, for providing electrical communication between said two fixed ends of said suspended arms; and via means connecting in-between said free ends of said suspended arms and said two ends of the inductor coil, respectively.

17. A 3-dimensional solenoid according to claim 16, wherein said solenoid is formed in a ground-signal-ground configuration for RE communication.

18. A 3-dimensional solenoid according to claim 11, wherein said inductor coil is formed in circular shape.

19. A 3-dimensional solenoid according to claim 11, wherein said inductor coil is formed in rectangular shape.

20. A 3-dimensional solenoid according to claim 16, wherein said via means is formed of a metal.

* * * * *